United States Patent
Liu et al.

(10) Patent No.: US 10,867,793 B2
(45) Date of Patent: Dec. 15, 2020

(54) SEMICONDUCTOR PACKAGE AND METHOD OF FABRICATING THE SAME

(71) Applicant: Taiwan Semiconductor Manufacturing Co., Ltd., Hsinchu (TW)

(72) Inventors: Zi-Jheng Liu, Taoyuan (TW); Hung-Jui Kuo, Hsinchu (TW); Ming-Che Ho, Tainan (TW); Ming-Tan Lee, Kaohsiung (TW); Tzung-Hui Lee, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/218,490

(22) Filed: Dec. 13, 2018

(65) Prior Publication Data

US 2020/0135453 A1  Apr. 30, 2020

Related U.S. Application Data

(60) Provisional application No. 62/752,368, filed on Oct. 30, 2018.

(51) Int. Cl.
*H01L 21/02* (2006.01)
*H01L 21/76* (2006.01)
*H01L 21/027* (2006.01)
*H01L 23/532* (2006.01)
(Continued)

(52) U.S. Cl.
CPC .... *H01L 21/0276* (2013.01); *H01L 21/76802* (2013.01); *H01L 21/76843* (2013.01); *H01L 21/76873* (2013.01); *H01L 23/53238* (2013.01); *H01L 23/53266* (2013.01); *H01L 24/09* (2013.01); *H01L 24/11* (2013.01); *H01L 24/14* (2013.01); *H01L 2224/0231* (2013.01);
(Continued)

(58) Field of Classification Search
CPC ......... H01L 24/09; H01L 24/11; H01L 24/14; H01L 23/53; H01L 23/532; H01L 23/5323; H01L 23/53238; H01L 23/5326; H01L 23/53266; H01L 21/02; H01L 21/027; H01L 21/0276; H01L 21/76; H01L 21/768; H01L 21/768; H01L 21/76802; H01L 21/7684; H01L 21/76843; H01L 21/7867; H01L 21/78673
USPC ....................................... 257/690
See application file for complete search history.

(56) References Cited

U.S. PATENT DOCUMENTS

| | | |
|---|---|---|
| 8,796,666 B1 | 8/2014 | Huang et al. |
| 9,012,132 B2 | 4/2015 | Chang |
| 9,093,530 B2 | 4/2015 | Huang et al. |

(Continued)

*Primary Examiner* — Monica D Harrison
(74) *Attorney, Agent, or Firm* — JCIPRNET

(57) ABSTRACT

A semiconductor package includes a substrate and a redistribution structure. The substrate has at least one contact. The redistribution structure is disposed on the substrate and electrically connected to the at least one contact, wherein the redistribution structure includes a plurality of redistribution layers. Each of the redistribution layers include a seed layer, a conductive material layer and a dielectric material layer. The conductive material layer is disposed on the seed layer. The dielectric material layer is surrounding the conductive material layer and the seed layer. At least one of the redistribution layers include an anti-reflective layer disposed in between the seed layer and the conductive material layer.

20 Claims, 15 Drawing Sheets

(51) Int. Cl.
*H01L 21/768* (2006.01)
*H01L 23/00* (2006.01)

(52) U.S. Cl.
CPC ............... *H01L 2224/02371* (2013.01); *H01L 2224/0401* (2013.01)

(56) References Cited

U.S. PATENT DOCUMENTS

| | | | |
|---|---|---|---|
| 9,028,915 | B2 | 5/2015 | Chang et al. |
| 9,146,469 | B2 | 9/2015 | Liu et al. |
| 9,213,234 | B2 | 12/2015 | Chang |
| 9,223,220 | B2 | 12/2015 | Chang |
| 9,256,133 | B2 | 2/2016 | Chang |
| 9,536,759 | B2 | 1/2017 | Yang et al. |
| 9,548,303 | B2 | 1/2017 | Lee et al. |
| 2015/0162280 | A1* | 6/2015 | Pan ................... H01L 21/0337 257/774 |
| 2015/0348877 | A1* | 12/2015 | Huang ................ H01L 23/488 257/734 |
| 2019/0139925 | A1* | 5/2019 | Yu ..................... H01L 25/0652 |

\* cited by examiner

US 10,867,793 B2

SEMICONDUCTOR PACKAGE AND METHOD OF FABRICATING THE SAME

CROSS-REFERENCE TO RELATED APPLICATION

This application claims the priority benefits of U.S. provisional application Ser. No. 62/752,368, filed on Oct. 30, 2018. The entirety of the above-mentioned patent application is hereby incorporated by reference herein and made a part of this specification.

BACKGROUND

Packaging technologies for integrated circuits involve encapsulating an integrated circuit (IC) die in encapsulation material and building the required redistribution layer. The formation of fine-pitch redistribution layers allows for fabricating smaller packages with high integration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
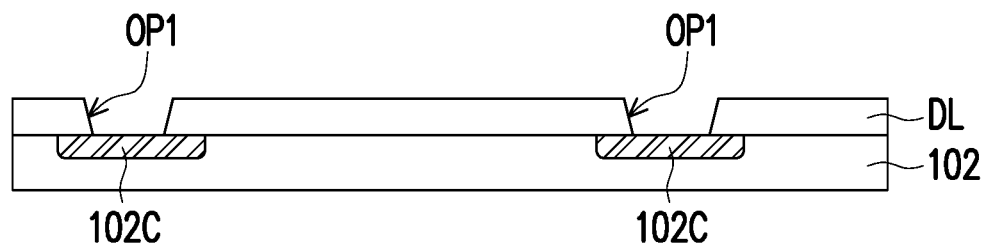
FIG. 1A to FIG. 1H are schematic cross-sectional views of various stages in a method of fabricating a semiconductor package according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1A to FIG. 1H are schematic cross-sectional views of various stages in a method of fabricating a semiconductor package according to some exemplary embodiments of the present disclosure. Referring to FIG. 1A, a substrate 102 having a plurality of contacts 102C is provided. In some embodiments, the substrate 102 may include one or more semiconductor chips or plural dies of a semiconductor wafer or a reconstituted wafer. In certain embodiments, the substrate 102 is a reconstituted wafer including a plurality of dies molded in a molding compound. In some embodiments, the contacts 102C are contact pads or conductive pads of the die(s). In some embodiments, the substrate 102 may be a monocrystalline semiconductor substrate such as a silicon substrate, a silicon-on-insulator (SOI) substrate or a germanium-on-insulator (GOI) substrate, for example. In accordance with the embodiments, the semiconductor substrate may include other conductive layers, doped regions or other semiconductor elements, such as transistors, diodes or the like. The embodiments are intended for illustration purposes but not intended to limit the scope of the present disclosure.

As illustrated in FIG. 1A, a dielectric material layer DL is formed over the substrate 102 to cover the substrate 102. The dielectric material layer DL is formed with a plurality of first openings OP1 that partially expose the contacts 102C of the substrate 102. In some embodiments, the dielectric material layer DL is formed by first forming a dielectric material (not shown) on the substrate 102, then patterning the dielectric material to form the dielectric material layer DL having the first openings OP1. In some embodiments, the dielectric material layer DL is formed by a coating process such as spin-coating process, or a deposition process including a chemical vapor deposition (CVD) process. In some embodiments, the dielectric material layer DL is, for example, polymers such as polyimide, benzocyclobutene (BCB), polybenzoxazole (PBO), or the like. In some alternative embodiments, the dielectric material layer DL may include non-organic dielectric materials such as silicon oxide, silicon nitride, silicon carbide, silicon oxynitride, or the like. However, the disclosure is not limited thereto, and the material of the dielectric material layer DL may be selected based on design requirement.

Figure 1B:
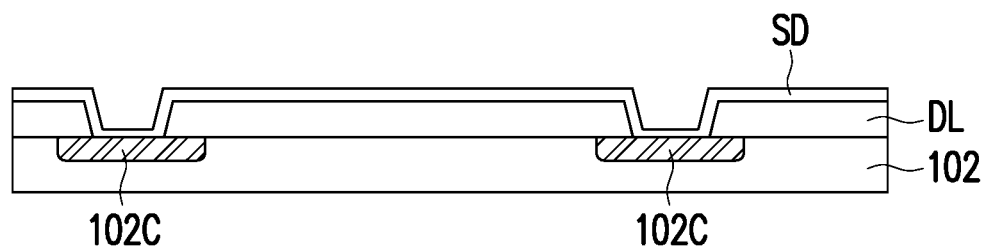

Referring to FIG. 1B, in a next step, a seed layer SD is conformally formed over the dielectric material layer DL and within the first openings OP1. In some embodiments, the seed layer SD covers and is in contact with top surfaces and side walls of the dielectric material layer DL. In certain embodiments, the seed layer SD covers and is in contact with the contacts 102C of the substrate 102. In some embodiments, the seed layer SD is formed by chemical vapor deposition (CVD), physical vapor deposition (PVD), atomic layer deposition (ALD), high density plasma CVD (HDPCVD) or combinations thereof. In certain embodiments, the seed layer SD is formed by sequentially depositing or sputtering a titanium layer and a copper layer (not shown), the disclosure is not limited thereto.

Figure 1C:
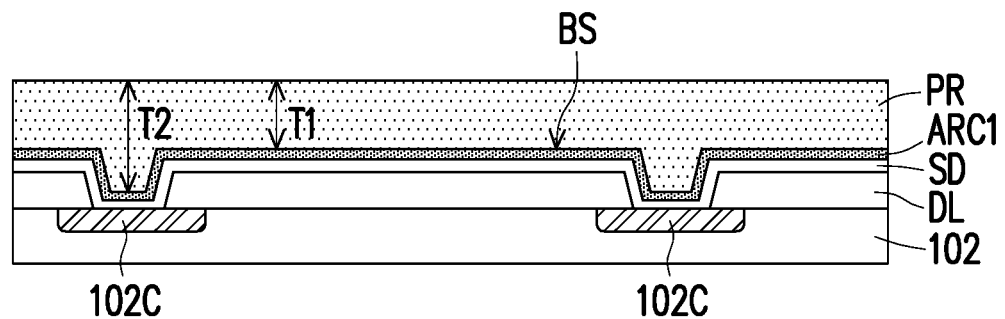

Referring to FIG. 1C, after forming the seed layer SD, a photoresist PR having an anti-reflective layer ARC1 located on one surface of the photoresist PR is provided. In the exemplary embodiment, the photoresist PR having the anti-reflective layer ARC1 coated thereon is formed by forming a bottom anti-reflective layer ARC1 on the seed layer SD, and providing the photoresist PR on the bottom anti-reflective layer ARC1 so that the bottom anti-reflective layer ARC1 is located on a bottom surface BS of the photoresist PR. In the illustrated embodiment, the anti-reflective layer ARC1 is an inorganic bottom anti-reflective layer ARC1 conformally formed over the seed layer SD. In other words, a profile of the anti-reflective layer ARC1 corresponds to a profile of the seed layer SD, and the anti-reflective layer ARC1 is formed with uniform thickness. In certain embodiments, the inorganic bottom anti-reflective layer ARC1 is made of materials such as titanium nitride, which has a suitable refractive index and extinction coefficient (n/k values) to act as an anti-reflective coating. In alternative embodiments, other materials having similar refractive index and extinction coefficient (n/k values) to titanium nitride can be used as the anti-reflective layer. In some embodiments, the photoresist PR is formed over the anti-reflective layer ARC1 with a varied thickness. For example, some portions of the photoresist PR may be formed with a first thickness T1, while some other portions of the photoresist PR may be formed with a second thickness T2, wherein the second thickness T2 is greater than the first thickness T1.

Figure 1D:
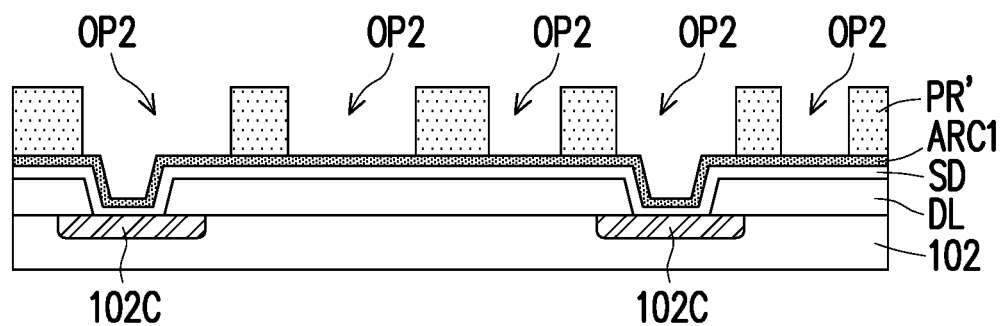

Referring to FIG. 1D, in a next step, the photoresist PR is patterned to form a plurality of second openings OP2. For example, the patterned photoresist PR' is formed with the second openings OP2 to reveal the inorganic bottom anti-reflective layer ARC1 located underneath. In the exemplary embodiment, since an anti-reflective layer ARC1 is covering the seed layer SD, the high reflective properties of the seed layer SD can be alleviated. As such, an issue of standing wave profiles of the patterned photoresist PR' caused by reflective lights can be resolved. Thereafter, the redistribution structure formed in subsequent steps can have the desired profile, and a reliability and performance of the redistribution structure can be improved.

Figure 1E:
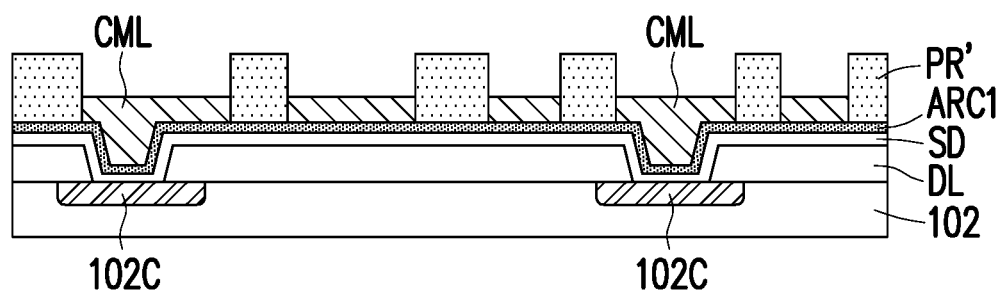

Referring to FIG. 1E, after forming the patterned photoresist PR', a conductive material layer CML is formed within the plurality of second openings OP2 over the anti-reflective layer ARC1 and the seed layer SD. In the exemplary embodiment, the conductive material layer CML is formed on the anti-reflective layer ARC1 and is in contact with the anti-reflective layer ARC1. In some embodiments, the anti-reflective layer ARC1 is located in between the conductive material layer CML and the seed layer SD. In some embodiments, the formation of the conductive material layer CML includes forming a copper layer or a copper alloy layer (not shown) on the anti-reflective layer ARC1 by electroplating to fill into the second openings OP2. In certain embodiments, the conductive material layer CML is formed by a chemical vapor deposition (CVD) process, an electrochemical plating (ECP) process or even a sputtering process. However, the scope of this disclosure is not limited to the materials and descriptions disclosed above.

Figure 1F:
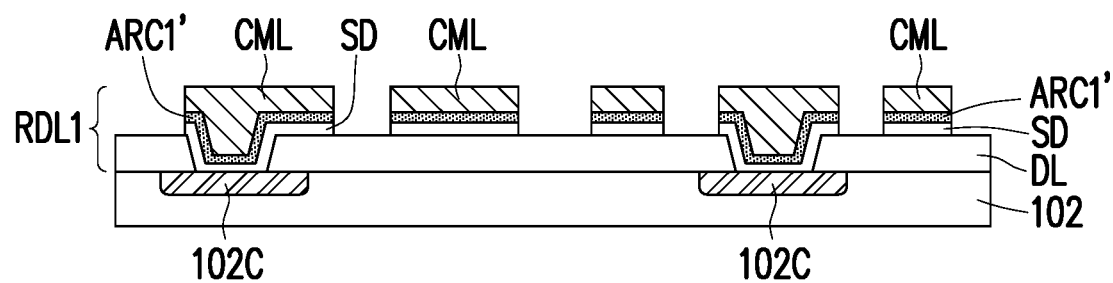

Referring to FIG. 1F, after forming the conductive material layer CML, the patterned photoresist PR' is removed or stripped off, and portions of the seed layer SD and the anti-reflective layer ARC1 not covered by the conductive material layer CML are also removed. In other words, portions of the seed layer SD and the anti-reflective layer ARC1' located below the conductive material layer CML are retained, while other portions of the seed layer SD and the anti-reflective layer ARC1 are removed. After removing the patterned photoresist PR' and removing portions of the seed layer SD and the anti-reflective layer ARC1, the remaining seed layer SD and the anti-reflective layer ARC1' have sidewalls that are aligned with sidewalls of the conductive material layer CML. In some embodiments, the conductive material layer CML has a planar top surface due to a bottom-up plating process. In some embodiments, the remaining anti-reflective layer ARC1' is sandwiched in between the conductive material layer CML and the seed layer SD. Up to here, a first redistribution layer RDL1 having a seed layer SD, an anti-reflective layer ARC1', a conductive material layer CML and a dielectric material layer DL is accomplished. For example, in the illustrated embodiment, the anti-reflective layer ARC1' is disposed on the seed layer, the conductive material layer CML is disposed on the anti-reflective layer ARC1', and the dielectric material layer DL surround portions of the seed layer SD, the anti-reflective layer ARC1' and the conductive material layer CML.

Figure 1G:
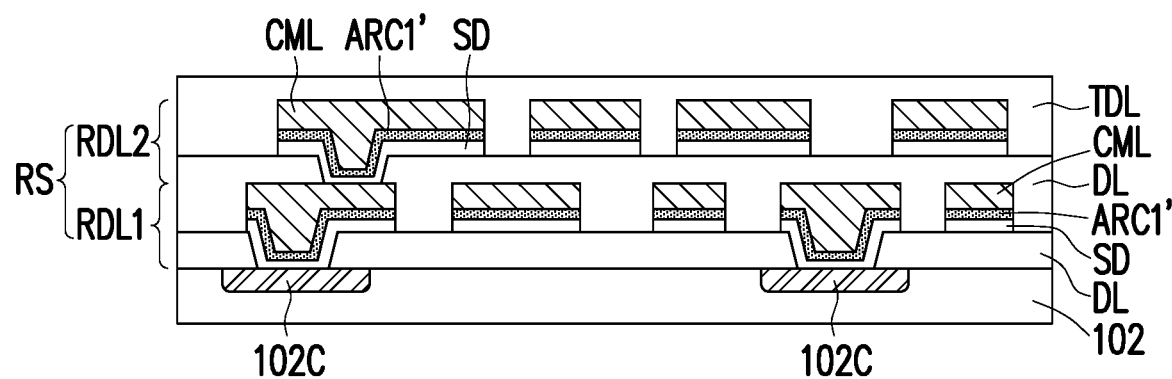

Referring to FIG. 1G, the steps shown in FIG. 1A to FIG. 1F may then be repeated to form a second redistribution layer RDL2 over the first redistribution layer RDL1. For example, a dielectric material layer DL, a seed layer SD, an anti-reflective layer ARC1' and a conductive material layer CML of the second redistribution layer RDL2 are formed in the same way as described for the first redistribution layer RDL1. For example, in some embodiments, the second redistribution layer RDL2 is formed by first forming a dielectric material layer DL over the top surface of the dielectric material layer DL of the first redistribution layer RDL1 and to cover a top surface of the conductive material layer CML of the first redistribution layer RDL1. The dielectric material layer DL of the second redistribution layer RDL2 has openings that reveal the conductive material layer CML of the first redistribution layer RDL1. Thereafter, the seed layer SD, the anti-reflective layer ARC1' and the conductive material layer CML may be sequentially formed within the openings in the same way as described above. After forming the desired number of redistribution layers, a top dielectric material layer TDL is formed to cover the top-most redistribution layer. In the exemplary embodiment, only two redistribution layers (RDL1/RDL2) are formed, thus the top dielectric material layer TDL is formed to cover the second redistribution layer RDL2. However, the disclosure is not limited thereto. In some other embodiments, the number of redistribution layers formed in the redistribution structure RS may be adjusted based on product requirement.

Figure 1H:
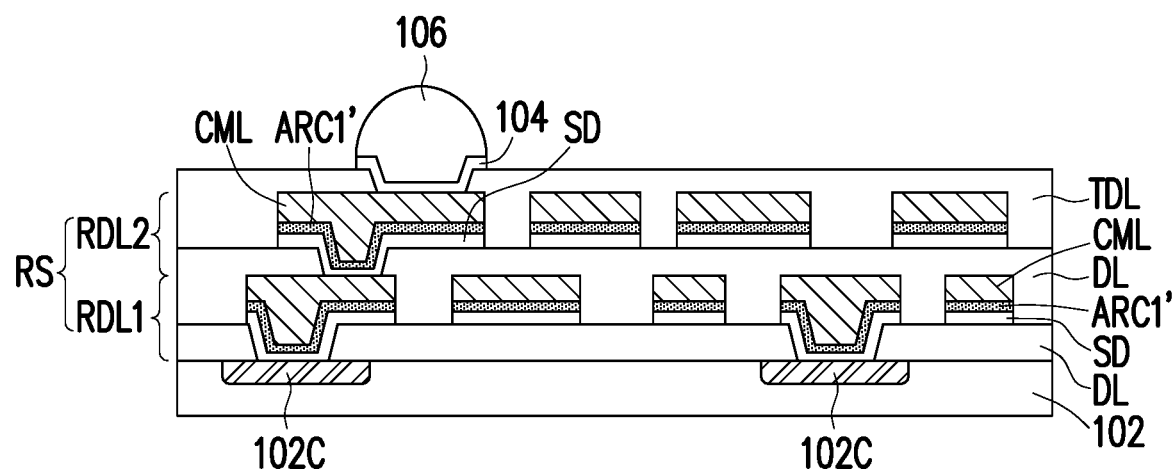

Referring to FIG. 1H, in some embodiments, after forming the redistribution structure RS, the top dielectric material layer TDL is patterned to form openings that reveal the top-most conductive material layer CML of the redistribution structure RS. Subsequently, a conductive pad 104 may be disposed on an exposed top surface of the conductive material layer CML over the top dielectric material layer TDL. In some embodiments, the conductive pad 104 is, for example, under-ball metallurgy (UBM) patterns used for ball mount. In some embodiments, the materials of the conductive pad 104 may include copper, nickel, titanium, tungsten, or alloys thereof or the like, and may be formed by an electroplating process, for example. After forming the conductive pad 104, a conductive ball 106 may be disposed on the conductive pad 104 over the redistribution structure RS. In some embodiments, the conductive ball 106 is, for example, solder balls or ball grid array (BGA) balls. In certain embodiments, the conductive ball 106 is electrically connected to the conductive material layer CML of the redistribution structure RS through the conductive pad 104. Although only one conductive ball 106 is illustrated in the embodiment, however, the disclosure is not limited thereto. It should be noted that the number of conductive balls 106 disposed on the redistribution structure RS may be adjusted based on design requirements.

Figure 2A:
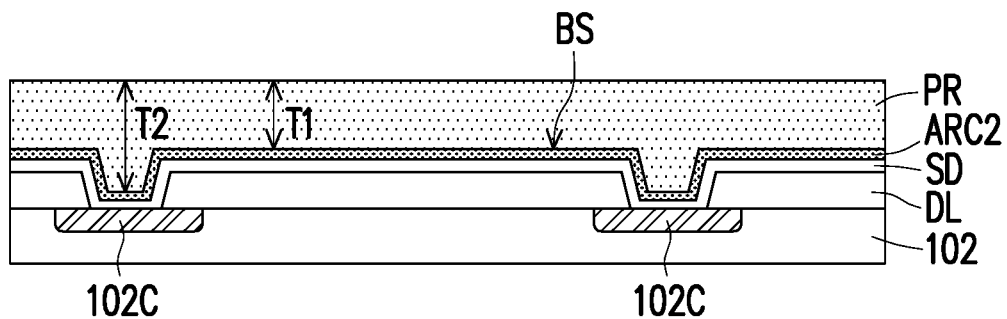
FIG. 2A to FIG. 2E are schematic cross-sectional view of various stages in a method of fabricating a semiconductor package according to some other exemplary embodiments of the present disclosure.

FIG. 2A to FIG. 2E are schematic cross-sectional view of various stages in a method of fabricating a semiconductor package according to some other exemplary embodiments of the present disclosure. The embodiment shown in FIG. 2A to FIG. 2E is similar to the embodiment shown in FIG. 1A to 1H, hence the same reference numerals are used to refer to the same or liked parts, and its detailed description will be omitted herein. The difference between the embodiment shown in FIG. 2A to FIG. 2E and the embodiment shown in FIG. 1A to 1H is in the design of the anti-reflective layer. Referring to FIG. 2A, a photoresist PR having an anti-reflective layer ARC2 located on one surface of the photoresist PR is provided. In the exemplary embodiment, the photoresist PR having the anti-reflective layer ARC2 coated thereon is formed by forming a bottom anti-reflective layer ARC2 on the seed layer SD, and providing the photoresist PR on the bottom anti-reflective layer ARC2 so that the bottom anti-reflective layer ARC2 is located on a bottom surface BS of the photoresist PR. In the illustrated embodiment, the anti-reflective layer ARC2 is an organic bottom anti-reflective layer ARC2 conformally formed over the seed layer SD. In other words, a profile of the anti-reflective layer ARC2 corresponds to a profile of the seed layer SD, and the anti-reflective layer ARC2 is formed with uniform thickness. In certain embodiments, the organic anti-reflective layer ARC2 is made of materials such as ethyl lactate, resin, additives (add dye/binder to control the organic material n/k values to n~1.7-1.9, k~0.35), and solvents (such as, 1-methoxy-2-propanol propanol, PGME (Propylene glycol monomethyl ether)). Furthermore, the photoresist PR is formed over the anti-reflective layer ARC2 with a varied thickness.

Figure 2B:
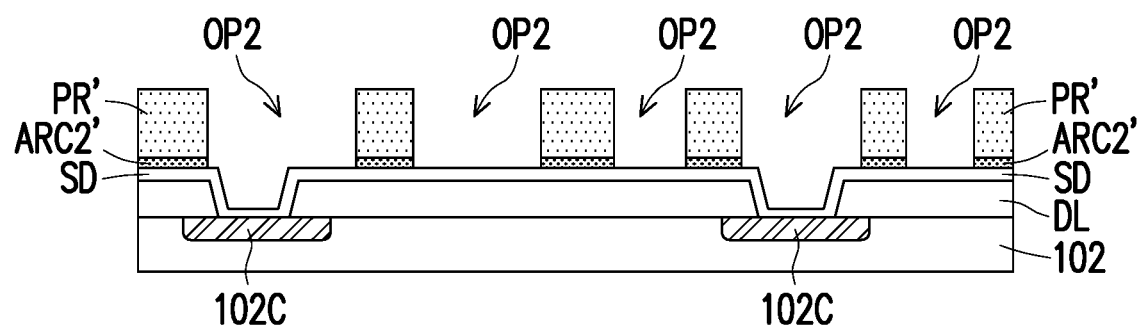

Referring to FIG. 2B, in a subsequent step, the photoresist PR and the anti-reflective layer ARC2 are patterned to form a plurality of second openings OP2. In the exemplary embodiments, the photoresist PR and the anti-reflective layer ARC2 are for example patterned in two steps. That is, the photoresist PR is first patterned to form the patterned photoresist PR', thereafter, the anti-reflective layer ARC2 is patterned to form the patterned anti-reflective layer ARC2'. In the exemplary embodiment, since an anti-reflective layer ARC2 is covering the seed layer SD during the patterning of the photoresist PR, the high reflective properties of the seed layer SD can be alleviated. As such, an issue of standing wave profiles of the patterned photoresist PR' caused by reflective lights can be resolved. Thereafter, the redistribution structure formed in subsequent steps can have the desired profile, and a reliability and performance of the redistribution structure can be improved.

Figure 2C:
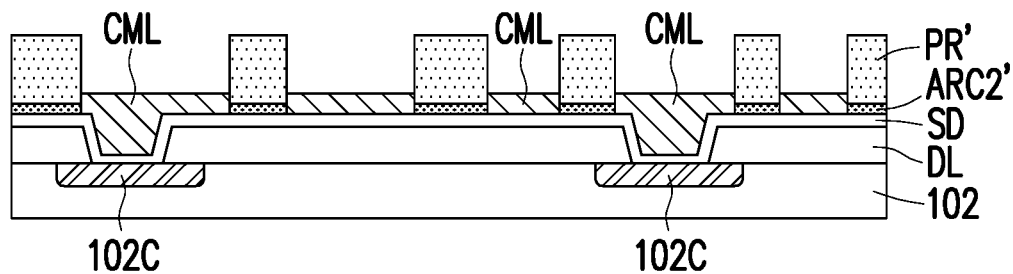
Figure 2D:
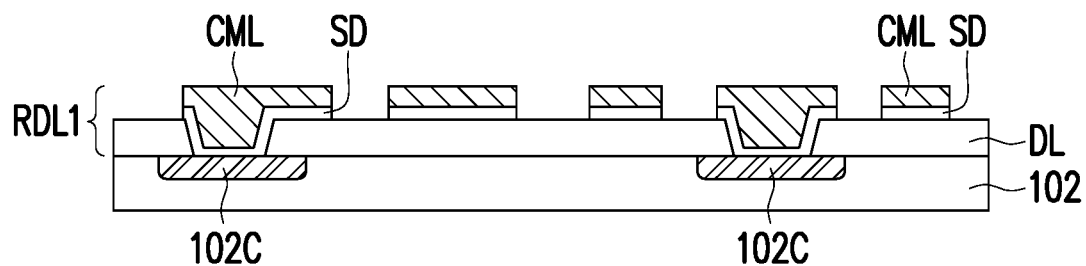

Referring to FIG. 2C, after forming the patterned photoresist PR', a conductive material layer CML is formed within the plurality of second openings OP2 over the seed layer SD. In the exemplary embodiment, the conductive material layer CML is formed on the seed layer SD to be in contact with the seed layer SD. Subsequently, referring to FIG. 2D, the patterned photoresist PR' is removed or stripped off, and portions of the seed layer SD not covered by the conductive material layer CML are also removed. In some embodiments, the organic anti-reflective layer ARC2' located below the patterned photoresist PR' is also removed during the removal of the patterned photoresist PR'. Up to here, a first redistribution layer RDL1 having a seed layer SD, a conductive material layer CML and a dielectric material layer DL is accomplished. For example, in the illustrated embodiment, the conductive material layer CML is disposed on the seed layer SD, and the dielectric material layer DL surround portions of the seed layer SD and the conductive material layer CML.

Figure 2E:
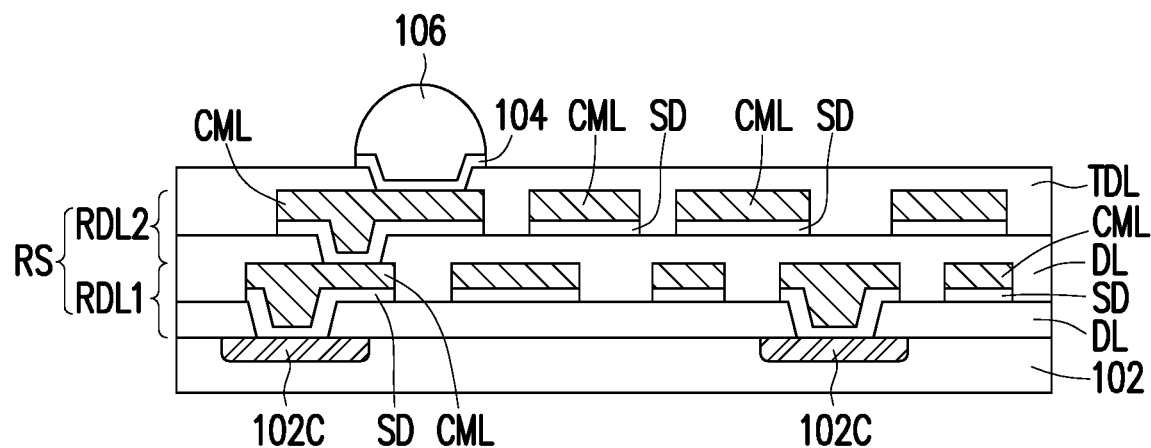

Referring to FIG. 2E, the steps shown in FIG. 2A to FIG. 2D may then be repeated to form a redistribution structure RS having two redistribution layers (RDL1/RDL2), wherein a second redistribution layer RDL2 is formed over the first redistribution layer RDL1. For example, a dielectric material layer DL, a seed layer SD and a conductive material layer CML of the second redistribution layer RDL2 are formed in the same way as described for the first redistribution layer RDL1. That is, the second redistribution layer RDL2 is also formed using an organic anti-reflective layer ARC2', which is removed during the removal of the photoresist PR'. After forming the redistribution structure RS and forming a top dielectric material layer TDL covering the second redistribution layer RDL2, a conductive pad 104 and a conductive ball 106 may be formed over the top dielectric material layer TDL in the same way as described in the previous embodiment.

Figure 3A:
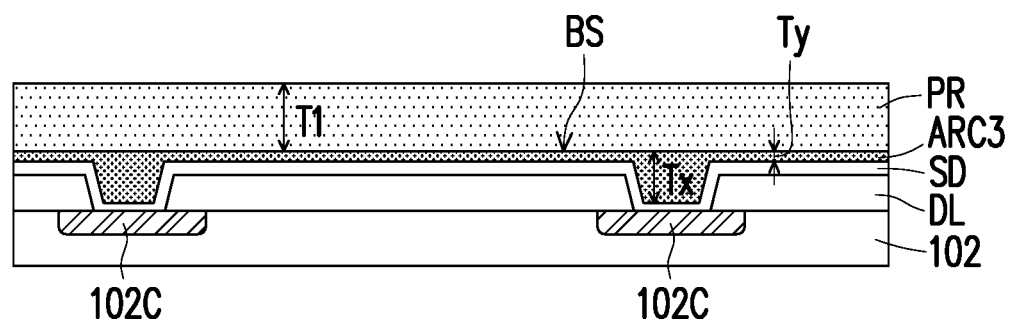
FIG. 3A to FIG. 3D are schematic cross-sectional view of various stages in a method of fabricating a semiconductor package according to some other exemplary embodiments of the present disclosure.

FIG. 3A to FIG. 3D are schematic cross-sectional view of various stages in a method of fabricating a semiconductor package according to some other exemplary embodiments of the present disclosure. The embodiment shown in FIG. 3A to FIG. 3D is similar to the embodiment shown in FIG. 2A to 2E, hence the same reference numerals are used to refer to the same or liked parts, and its detailed description will be omitted herein. The difference between the embodiment shown in FIG. 3A to FIG. 3D and the embodiment shown in FIG. 2A to 2E is in the design of the anti-reflective layer. Referring to FIG. 3A a photoresist PR having an anti-reflective layer ARC3 located on one surface of the photoresist PR is provided. In the exemplary embodiment, the photoresist PR having the anti-reflective layer ARC3 coated thereon is formed by forming a bottom anti-reflective layer ARC3 on the seed layer SD, and providing the photoresist PR on the bottom anti-reflective layer ARC3 so that the bottom anti-reflective layer ARC3 is located on a bottom surface BS of the photoresist PR. In the illustrated embodiment, the anti-reflective layer ARC3 is an organic bottom anti-reflective layer ARC3. A material of the anti-reflective layer ARC3 is the same as a material of the anti-reflective layer ARC2. However, in the exemplary embodiment, the anti-reflective layer ARC3 is formed over the seed layer SD with a planar top surface. In other words, to achieve planarity, the anti-reflective layer ARC3 is formed with a varied thickness. For example, some portions of the anti-reflective layer ARC3 has a thickness of Tx, and some other portions of the anti-reflective layer ARC3 has a thickness of Ty, wherein the thickness Tx is greater than the thickness Ty. Thereafter, the photoresist PR provided on the planar top surface of the anti-reflective layer ARC3 may have a uniform thickness of T1.

Figure 3B:
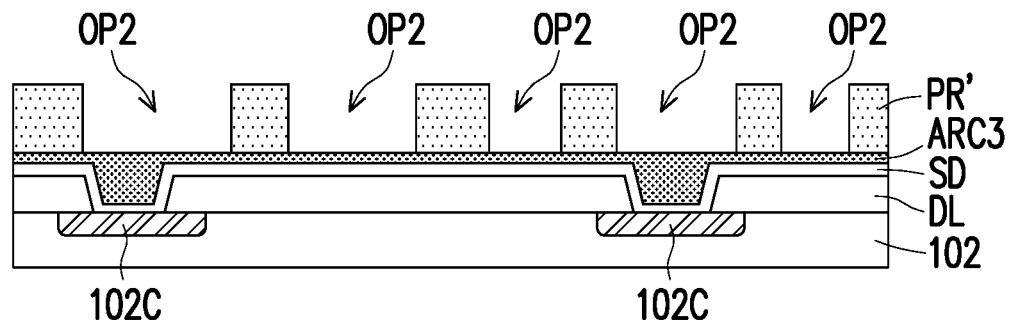
Figure 3C:
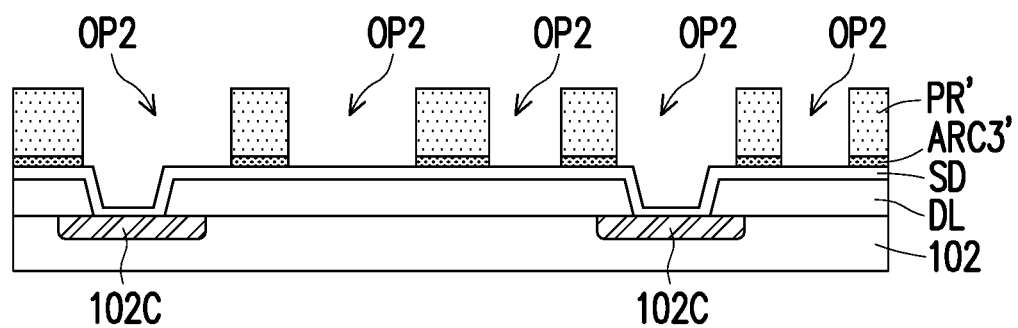

Referring to FIG. 3B and FIG. 3C, in a subsequent step, the photoresist PR and the anti-reflective layer ARC3 are patterned to form a plurality of second openings OP2. In the exemplary embodiments, the photoresist PR and the anti-reflective layer ARC3 are patterned in two steps. That is, the photoresist PR is first patterned to form the patterned photoresist PR', thereafter, the anti-reflective layer ARC3 is patterned to form the patterned anti-reflective layer ARC3'. In the exemplary embodiment, since an anti-reflective layer ARC3 is covering the seed layer SD during the patterning of the photoresist PR, the high reflective properties of the seed layer SD can be alleviated. As such, an issue of standing wave profiles of the patterned photoresist PR' caused by reflective lights can be resolved. Furthermore, the photoresist PR is formed with a uniform thickness on the anti-reflective layer ARC3. As such, a profile of the patterned photoresist PR' can be further improved. Thereafter, the redistribution structure formed in subsequent steps can have the desired profile, and a reliability and performance of the redistribution structure can be improved.

Figure 3D:
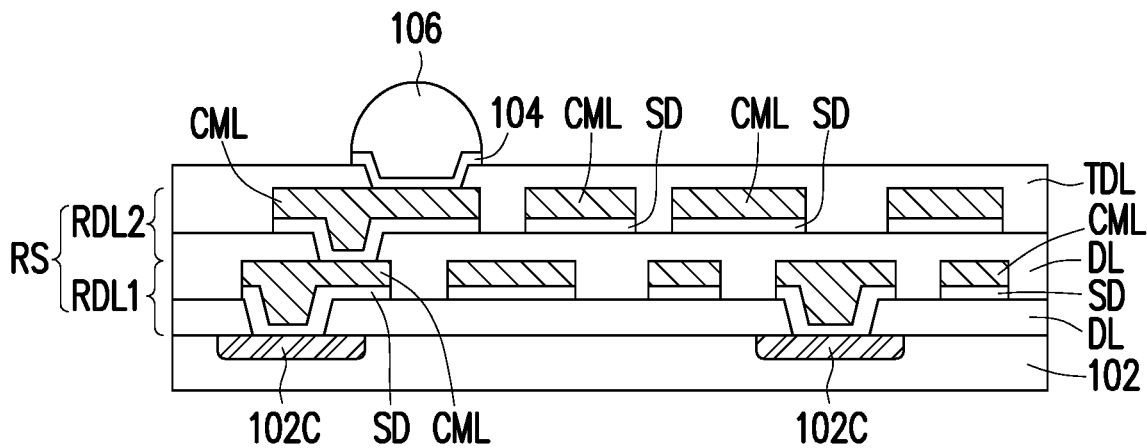

Referring to FIG. 3D, a conductive material layer CML is formed within the second opening OP2 on the seed layer SD. Thereafter, the patterned photoresist PR' is removed or stripped off, and portions of the seed layer SD not covered by the conductive material layer CML are also removed. The same steps of forming the dielectric material layer DL, the seed layer SD, the conductive material layer CML, and the removal of the photoresist PR' and the removal of the portions of the seed layer SD may then be repeated to form a redistribution structure RS having two redistribution layers (RDL1/RDL2). Similar to the above-mentioned embodiments, after forming the redistribution structure RS and forming a top dielectric material layer TDL covering the second redistribution layer RDL2, a conductive pad 104 and a conductive ball 106 may be formed over the top dielectric material layer TDL in the same way as described above.

Figure 4A:
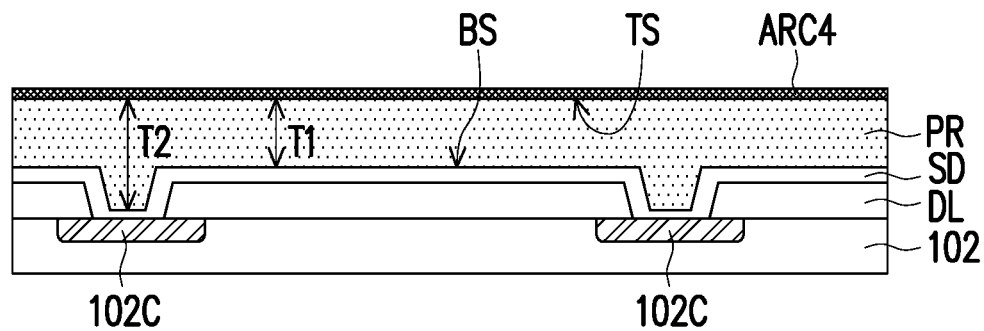
FIG. 4A to FIG. 4D are schematic cross-sectional view of various stages in a method of fabricating a semiconductor package according to some other exemplary embodiments of the present disclosure.

FIG. 4A to FIG. 4D are schematic cross-sectional view of various stages in a method of fabricating a semiconductor package according to some other exemplary embodiments of the present disclosure. The embodiment shown in FIG. 4A to FIG. 4D is similar to the embodiment shown in FIG. 2A to 2E, hence the same reference numerals are used to refer to the same or liked parts, and its detailed description will be omitted herein. The difference between the embodiment shown in FIG. 4A to FIG. 4D and the embodiment shown in FIG. 2A to 2E is in the design and location of the anti-reflective layer. Referring to FIG. 4A, a photoresist PR having an anti-reflective layer ARC4 located on one surface of the photoresist PR is provided. In the exemplary embodiment, the photoresist PR having the anti-reflective layer ARC4 coated thereon is formed by providing the photoresist PR on the seed layer SD, and forming a top anti-reflective layer ARC4 on a top surface TS of the photoresist PR.

Figure 4B:
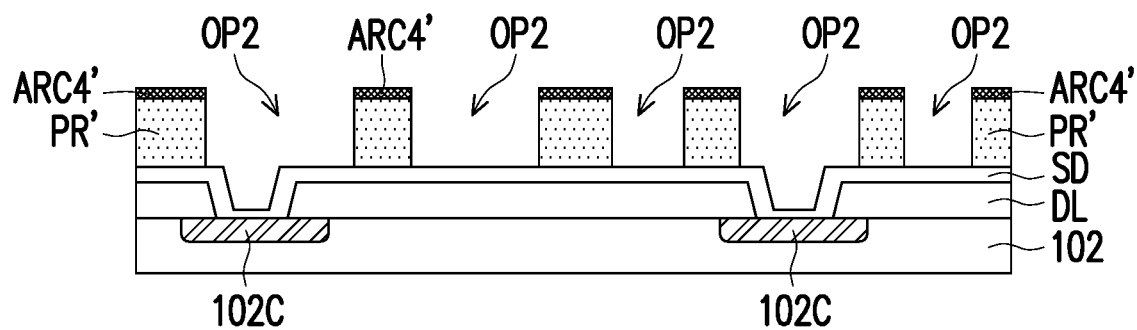

Referring to FIG. 4B, the photoresist PR and the anti-reflective layer ARC4 are patterned to form a plurality of second openings OP2. In the exemplary embodiment, since an anti-reflective layer ARC4 is covering the seed layer SD and the photoresist PR during the patterning of the photo- resist PR, the high reflective properties of the seed layer SD can be alleviated. As such, an issue of standing wave profiles of the patterned photoresist PR' caused by reflective lights can be resolved. Thereafter, the redistribution structure formed in subsequent steps can have the desired profile, and a reliability and performance of the redistribution structure can be improved.

Figure 4C:
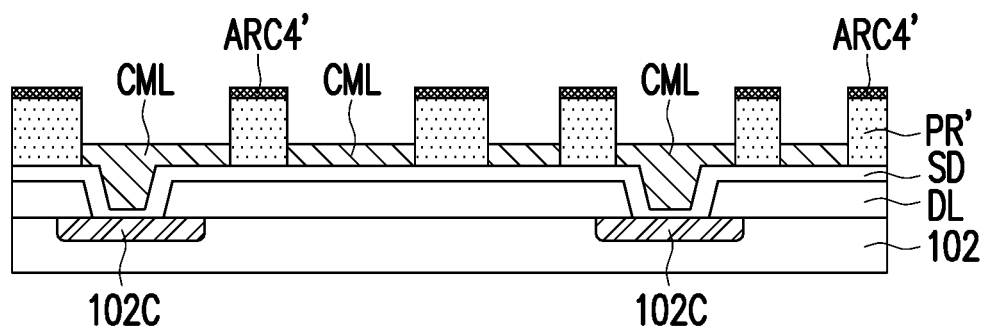
Figure 4D:
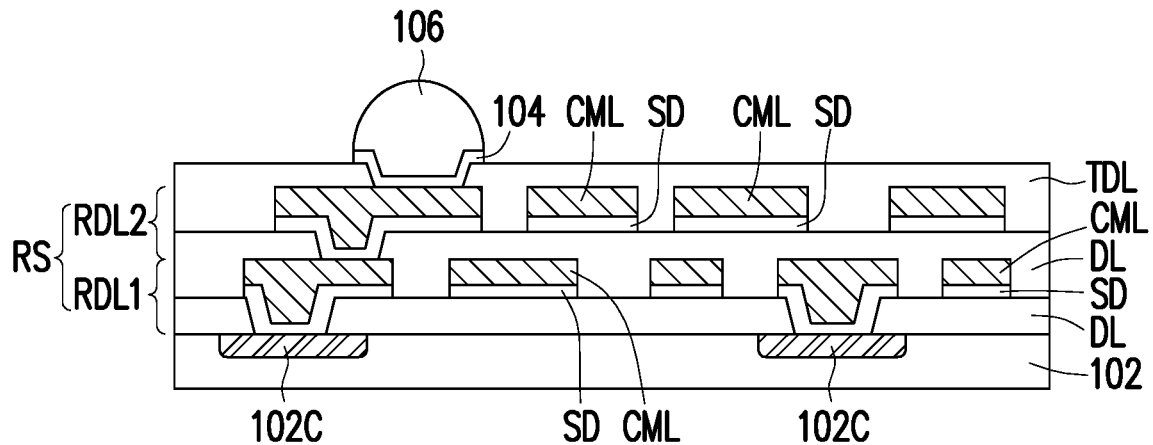

Referring to FIG. 4C, in a next step, a conductive material layer CML is formed with the second opening OP2 on the seed layer SD. Thereafter, the patterned photoresist PR' is removed or stripped off, and portions of the seed layer SD not covered by the conductive material layer CML are also removed. In the exemplary embodiment, the top anti-reflective layer ARC4' is also removed upon the removal of the patterned photoresist PR'. Referring to FIG. 4D, the same steps of forming the dielectric material layer DL, the seed layer SD, the conductive material layer CML, and the removal of the photoresist PR' and the removal of the portions of the seed layer SD may then be repeated to form a redistribution structure RS having two redistribution layers (RDL1/RDL2). Similar to the above-mentioned embodiments, after forming the redistribution structure RS and forming a top dielectric material layer TDL covering the second redistribution layer RDL2, a conductive pad 104 and a conductive ball 106 may be formed over the top dielectric material layer TDL in the same way as described above.

In the above embodiments, a method of fabricating a redistribution structure RS on the substrate 102 is described. The substrate 102 may be any types of substrates seen in integrated fan-out packages, fan-in packages, or other types of packages having a redistribution structure. The disclosure is not limited thereto. An example of forming the redistribution structure RS in integrated fan-out packages will be described next.

Figure 5A:
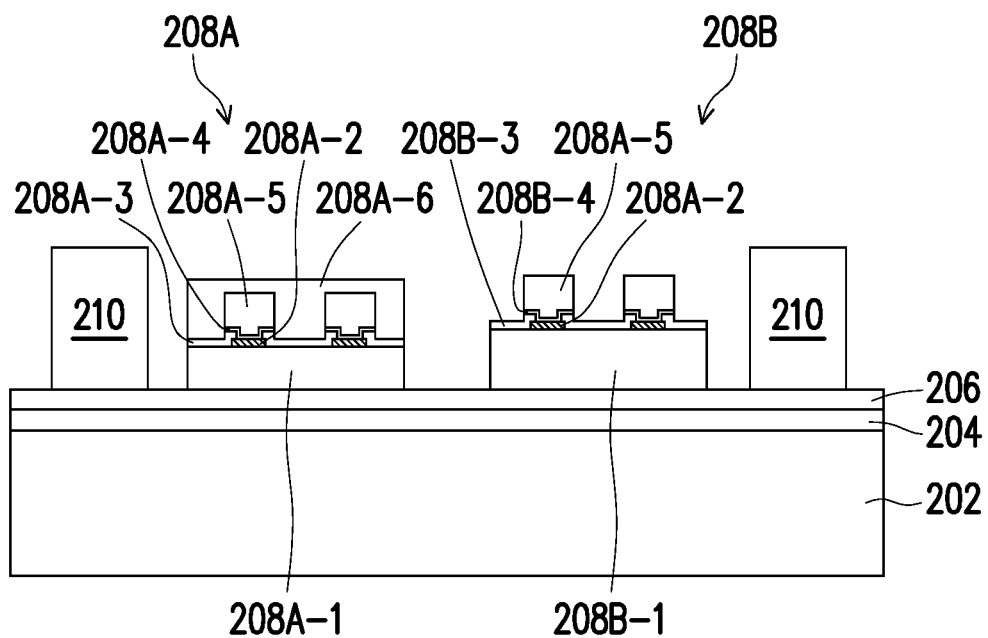
FIG. 5A to FIG. 5F are schematic cross-sectional views of various stages in a method of fabricating a semiconductor package according to some exemplary embodiments of the present disclosure.

FIG. 5A to FIG. 5F are schematic cross-sectional views of various stages in a method of fabricating a semiconductor package according to some exemplary embodiments of the present disclosure. Referring to FIG. 5A, a carrier 202 having a d-bonding layer 204 and a dielectric layer 206 formed thereon is provided. The de-bonding layer 204 is located in between the carrier 202 and the dielectric layer 206. In some embodiments, the carrier 202 may be a glass carrier, a ceramic carrier, or any suitable carrier for carrying a semiconductor wafer or a reconstituted wafer used for the method of fabricating the package structure. In some embodiments, the de-bonding layer 204 may be formed of a polymer-based material (such as a Light to Heat Conversion (LTHC) material), which may be removed along with the carrier 202 from the overlying structures by applying laser irradiation. In some other embodiments, the de-bonding layer 204 may be formed of an epoxy-based thermal release material.

In the exemplary embodiment, the dielectric layer 206 is formed on the de-bonding layer 204. The dielectric layer 206 may, for example, be made of dielectric materials such as benzocyclobutene ("BCB"), polybenzoxazole ("PBO"), or any other suitable polymer-based dielectric materials that may be easily patterned using a photo-lithography process. In some alternative embodiments, the dielectric layer 206 is formed of a nitride such as silicon nitride, an oxide such as silicon oxide, or the like. It is noted that the materials of the carrier 202, the de-bonding layer 204 and the dielectric layer 206 are not limited to the descriptions of the embodiments. In some alternative embodiments, the dielectric layer 206 may be omitted; in other words, merely the de-bonding layer 204 is formed over the carrier 202.

After forming the de-bonding layer 204 and the dielectric layer 206, a first semiconductor die 208A, a second semiconductor die 208B and a plurality of through insulator vias 210 are provided on the dielectric layer 206 over the carrier 202. In some embodiments, the through insulator vias 210 are through integrated fan-out ("InFO") vias. In one embodiment, the formation of the through insulator vias 210 includes forming a mask pattern (not shown) with openings, then forming a metallic material (not shown) filling up the openings by electroplating or deposition, and removing the mask pattern to form the through insulator vias 210 on the carrier 202. In one embodiment, the material of the through insulator vias 210 may include a metal material such as copper or copper alloys, or the like. However, the disclosure is not limited thereto. In an alternative embodiment, the through insulator vias 210 may be formed by forming a seed layer (not shown) on the dielectric layer 206; forming the mask pattern with openings exposing portions of the seed layer; forming the metallic material on the exposed portions of the seed layer to form the through insulator vias 210 by plating; removing the mask pattern; and then removing portions of the seed layer exposed by the through insulator vias 210. For example, the seed layer may be a titanium/copper composited layer.

Furthermore, as illustrated in FIG. 5A, the first semiconductor die 208A and the second semiconductor die 208B are placed on the dielectric layer 206. The first semiconductor die 208A and the second semiconductor die 208B may be the same types of die or different type of dies. For example, the first semiconductor die 208A and the second semiconductor die 208B may be application-specific integrated circuit ("ASIC") dies, high bandwidth memory (HBM) dies, sensor dies, wireless and radio frequency dies, memory dies, logic dies or voltage regulator dies. The disclosure is not limited thereto.

In some embodiments, the first semiconductor die 208A and the second semiconductor die 208B are attached or adhered on the dielectric layer 206 through a die attach film (DAF), an adhesion paste (not shown) or the like. In some embodiments, the first semiconductor die 208A and the second semiconductor die 208B includes a semiconductor substrate (208A-1, 208B-1), a plurality of conductive pads (208A-2, 208B-2), a passivation layer (208A-3, 208B-3), seed layers (208A-4, 208B-4) and a plurality of conductive vias (208A-5, 208B-5). In certain embodiments, the first semiconductor die 208A further includes a protection layer 208A-6.

As illustrated in FIG. 5A, the plurality of conductive pads (208A-2, 208B-2) is disposed on the semiconductor substrate (208A-1, 208B-1). The passivation layer (208A-3, 208B-3) is formed over the semiconductor substrate (208A-1, 208B-1) and has openings that partially expose the conductive pads (208A-2, 208B-2) on the semiconductor substrate (208A-1, 208B-1). The semiconductor substrate (208A-1, 208B-1) may be a bulk silicon substrate or a silicon-on-insulator (SOI) substrate, and further includes active components (e.g., transistors or the like) and optionally passive components (e.g., resistors, capacitors, inductors or the like) formed therein. In some embodiments, a thickness of the semiconductor substrate 208A-1 of the first semiconductor die 208A is different than a thickness of the semiconductor substrate 208B-1 of the second semiconductor die 208B. In some embodiments, the conductive pads (208A-2, 208B-2) may be aluminum pads, copper pads or other suitable metal pads. The passivation layer (208A-3, 208B-3) may be a silicon oxide layer, a silicon nitride layer, a silicon oxy-nitride layer or a dielectric layer formed of any suitable dielectric materials.

Furthermore, in some embodiments, the seed layers (208A-4, 208B-4) are disposed in the openings of the passivation layer (208A-3, 208B-3) over the conductive pads (208A-2, 208B-2). In certain embodiments, the conductive vias (208A-5, 208B-5) are formed on the seed layers (208A-4, 208B-4) by plating. In some embodiments, the seed layers (208A-4, 208B-4) are formed by sequentially depositing or sputtering a titanium layer and a copper layer. In some embodiments, the conductive vias (208A-5, 208B-5) may be formed of suitable materials such as copper, copper alloys, or the like. In certain embodiments, the first semiconductor die 208A further includes a protection layer 208A-6 disposed over the passivation layer 208A-3 and covering the conductive vias 208A-5. In some embodiments, the protection layer 208A-6 may be a polybenzoxazole (PBO) layer, a polyimide (PI) layer or other suitable polymers. In some alternative embodiments, the protection layer 208A-6 may be made of inorganic materials.

In the exemplary embodiment, the first semiconductor die 208A and the second semiconductor die 208B placed on the dielectric layer 206 may be arranged in an array, and when the first semiconductor die 208A and the second semiconductor die 208B are arranged in an array, the through insulator vias 210 may be classified into groups. The number of the semiconductor dies (208A/208B) may correspond to the number of the groups of the through insulator vias 210. In the illustrated embodiment, the first semiconductor die 208A and the second semiconductor die 208B may be picked and placed on the dielectric layer 206 after the formation of the through insulator vias 210. However, the disclosure is not limited thereto. In some alternative embodiments, the first semiconductor die 208A and the second semiconductor die 208B may be picked and placed on the dielectric layer 206 before the formation of the through insulator vias 210.

Figure 5B:
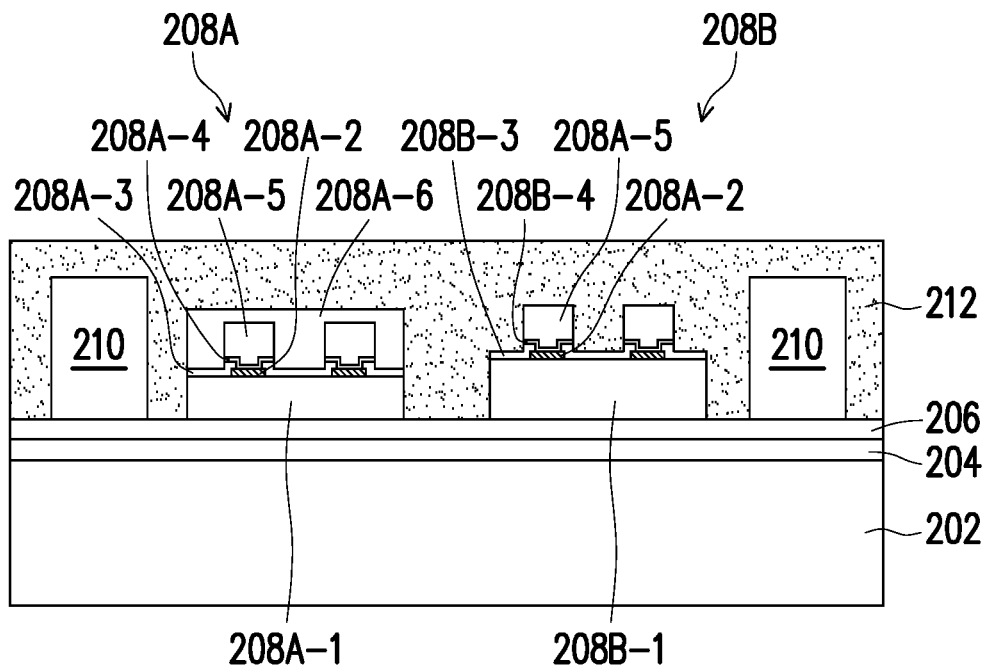

Referring to FIG. 5B, after forming the through insulator vias 210 and providing the semiconductor dies (208A/208B), an insulting material 212 is formed on the dielectric layer 206 covering the through insulator vias 210 and the semiconductor dies (208A/208B). In some embodiments, the insulating material 212 is formed through, for example, a compression molding process, filling up the gaps between the semiconductor dies (208A/208B) and adjacent through insulator vias 210 to encapsulate the semiconductor dies (208A/208B). The insulating material 212 also encapsulates the through insulator vias 210. In some embodiments, the conductive vias (208A-5, 208B-5) and the protection layer 208A-6 of the semiconductor dies (208A/208B) are encapsulated by and well protected by the insulating material 212. In other words, the conductive vias (208A-5, 208B-5) and the protection layer 208A-6 are not revealed and are well protected by the insulating material 212.

In some embodiments, the insulating material 212 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 212 may include an acceptable insulating encapsulation material. In some embodiments, the insulating material 212 may further include inorganic filler or inorganic compound (e.g. silica, clay, and so on) which can be added therein to optimize coefficient of thermal expansion (CTE) of the insulating material 212. The disclosure is not limited thereto.

Figure 5C:
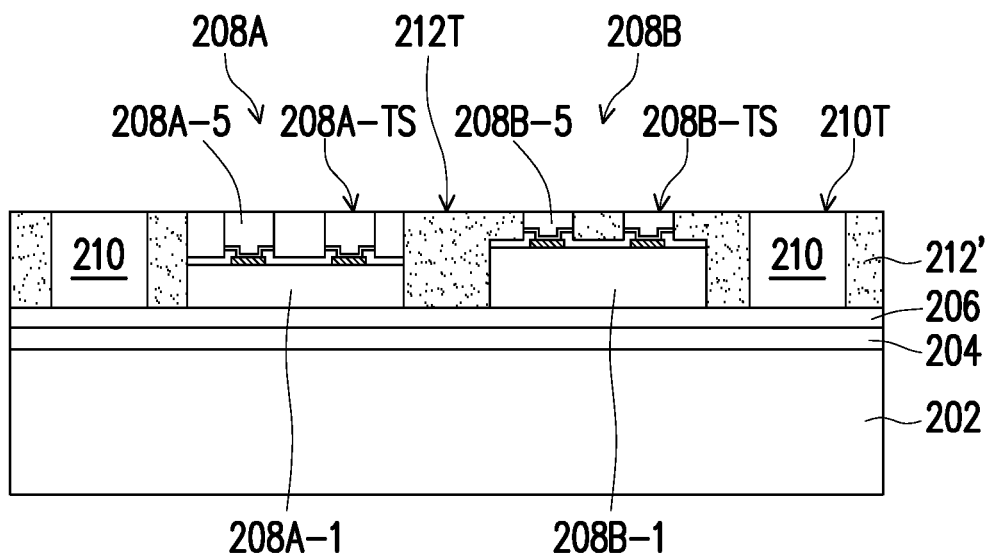

Referring to FIG. 5C, in a next step, the insulating material 212 and the protection layer 208A-6 of the first semiconductor die 208A are ground or polished by a mechanical grinding process and/or a chemical mechanical polishing (CMP) process until the top surfaces (208A-TS/208B-TS) of the conductive vias (208A-5, 208B-5) are revealed. In some embodiments, the through insulator vias 210 and the conductive vias 208B-5 of the second semiconductor die 208B may be partially polished so that the top surfaces 210T of the through insulator vias 210 are leveled with top surfaces (208A-TS/208B-TS) of the conductive vias (208A-5, 208B-5). The insulating material 212 is polished to form an insulating encapsulant 212'. In some embodiments, the top surface 212T of the insulating encapsulant 212' is coplanar with the top surfaces 210T of the through insulator vias 210 and the top surfaces (208A-TS/208B-TS) of the conductive vias (208A-5, 208B-5).

Figure 5D:
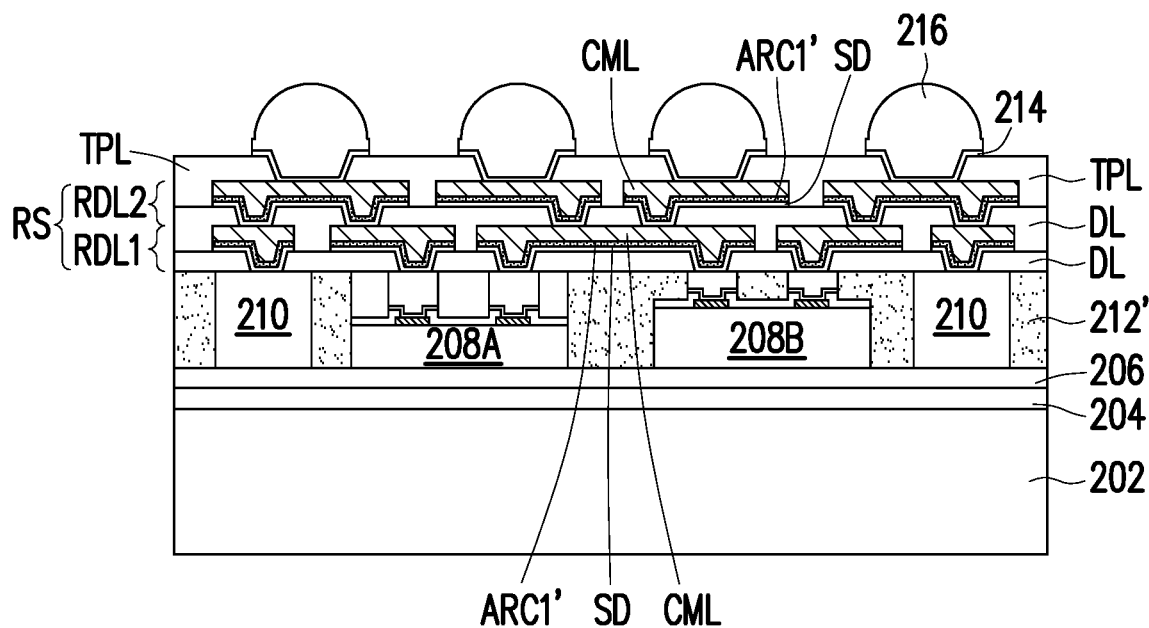

Referring to FIG. 5D, after forming the insulating encapsulant 212', a redistribution structure RS is formed over the insulating encapsulant 212'. The method of forming the redistribution structure RS is similar to the method described in the embodiment of FIG. 1A to FIG. 1H. Therefore, the same reference numerals are used to refer to the same or liked parts and its detailed description is omitted herein. In brief, the redistribution structure RS is formed by the following steps. For example, a dielectric material (not shown) is patterned to form a dielectric material layer DL having openings that expose the contacts (conductive vias 208A-5, 208B-5) of the semiconductor dies (208A/208B). A seed layer SD is then conformally formed over the dielectric material layer DL and in the openings. Subsequently, a photoresist (not shown) having a bottom anti-reflective layer ARC1' coated thereon is provided, and the photoresist is then patterned to form a plurality of second openings. A conductive material layer CML is then formed within the second openings over the bottom anti-reflective layer ARC1'. Thereafter, the patterned photoresist is removed or stripped off, and portions of the seed layer SD and the anti-reflective layer ARC1 not covered by the conductive material layer CML are also removed.

The same steps of forming the dielectric material layer DL, the seed layer SD, the anti-reflective layer ARC1', the conductive material layer CML, and the removal of the photoresist PR' and the removal of portions of the seed layer SD/portions of the anti-reflective layer ARC1 may then be repeated to form a redistribution structure RS having a plurality of redistribution layers. For example, in the exemplary embodiment, two redistribution layers (RDL1/RDL2) are formed. Subsequently, a top dielectric layer TDL is formed to cover the second redistribution layer RDL2. In some embodiments, the top dielectric layer TDL may be patterned to form openings that reveal the top-most conductive material layer CML of the redistribution structure RS. Subsequently, a plurality of conductive pads 214 may be disposed on the exposed top surfaces of the conductive material layer CML over the top dielectric material layer TDL. After forming the conductive pads 214, a plurality of conductive balls 216 may be disposed on the conductive pad 104 over the redistribution structure RS. The materials of the conductive pads 214 and the conductive balls 216 may be similar to the conductive pad 104 and the conductive ball 106 described in FIG. 1H, and its detailed description will be omitted herein.

Figure 5E:
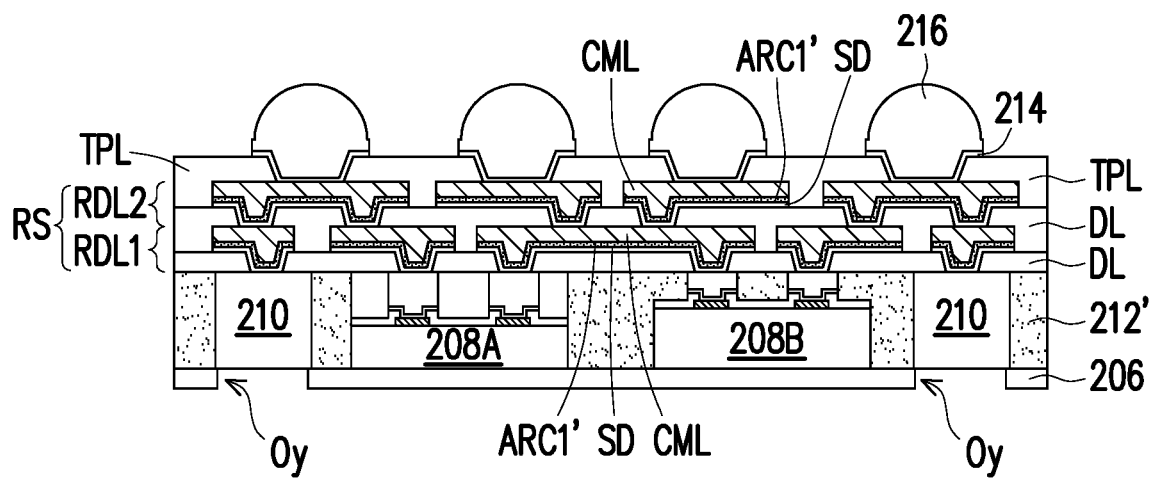

Referring to FIG. 5E, after the conductive balls 216 are disposed on the redistribution structure RS, the dielectric layer 206 is de-bonded from the de-bonding layer 204. For example, the dielectric layer 206 is separated from the de-bonding layer 204 and the carrier 202. In some embodiments, the de-bonding layer 204 (e.g., the LTHC release layer) may be irradiated by an UV laser such that the dielectric layer 206 is peeled from the carrier 202. In certain embodiments, the de-bonding layer 204 may be further removed or peeled off so that de-bonding layer 204 is separated from the dielectric layer 206. As shown in FIG. 5E, the remaining dielectric layer 206 may then be patterned to form a plurality of openings Oy that expose the bottom surfaces of the through insulator vias 210. The number of openings Oy formed is corresponding to the number of the through insulator vias 210.

Figure 5F:
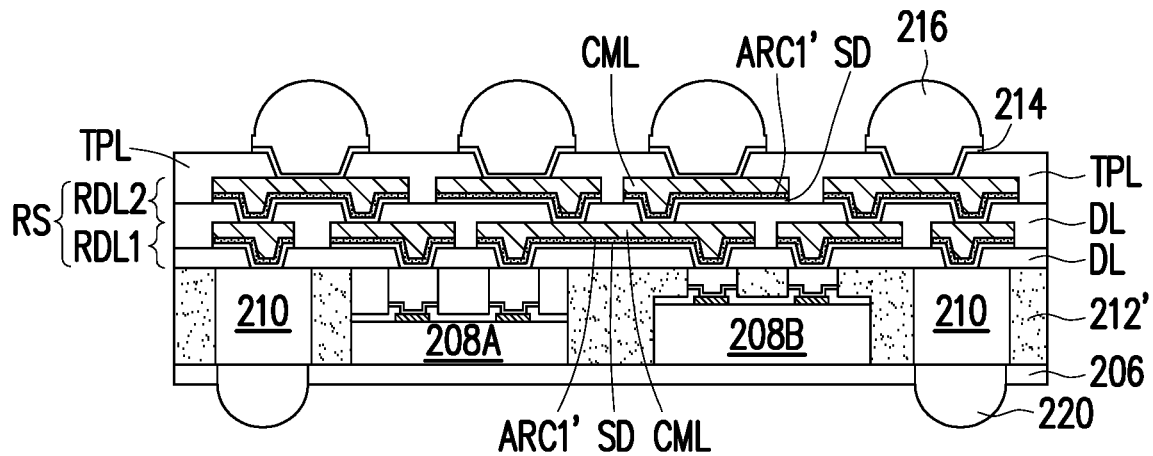

Referring to FIG. 5F, after the openings Oy are formed on the dielectric layer 206, a plurality of conductive balls 220 is placed on the bottom surface of the through insulator vias 210 exposed by the openings Oy. The conductive balls 220 are, for example, reflowed to bond with the bottom surfaces of the through insulator vias 210. After the conductive balls 220 are formed, a package structure having dual-side terminals is accomplished. In the redistribution structure RS shown in the embodiment of FIG. 5F, each of the redistribution layers (RDL1/RDL2) are formed with an anti-reflective layer ARC1' disposed in between the seed layer SD and the conductive material layer CML. That is, the redistribution layers (RDL1/RDL2) are formed by using the steps described in FIG. 1A to FIG. 1H. However, the disclosure is not limited thereto, and each of the redistribution layers (RDL1/RDL2) may be formed by any one of the methods described in the embodiment of FIG. 1A to FIG. 1H, in the embodiment of FIG. 2A to FIG. 2E, in the embodiment of FIG. 3A to FIG. 3D, or in the embodiment of FIG. 4A to FIG. 4D. In other words, the anti-reflective layer ARC1' may be omitted, and other anti-reflective layers (ARC2', ARC3' and ARC4') may be applied, and then removed in the final structure.

Figure 6:
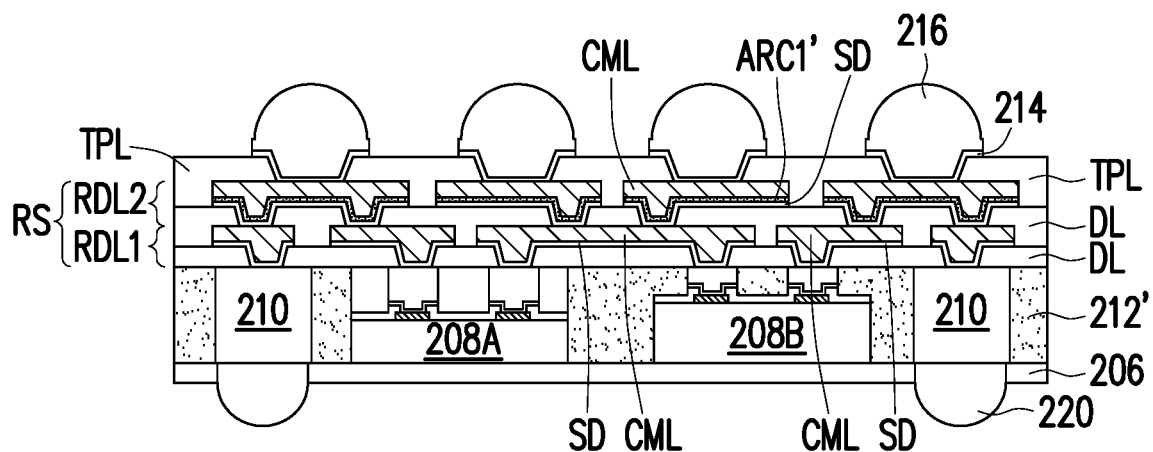
FIG. 6 is a schematic cross-sectional view of a semiconductor package according to some exemplary embodiments of the present disclosure.

FIG. 6 is a schematic cross-sectional view of a semiconductor package according to some exemplary embodiments of the present disclosure. The package structure shown in FIG. 6 is similar to the package structure shown in FIG. 5F, hence the same reference numerals are used to refer to the same and liked parts, and its detailed description is omitted herein. The difference between the embodiment shown in FIG. 6 and the embodiment shown in FIG. 5H is in the design of the redistribution structure RS. Referring to FIG. 6, the first redistribution layer RDL1 of the redistribution structure RS is formed without the anti-reflective layer ARC1' located in between the seed layer SD and the conductive material layer CML. Instead, the first redistribution layer RDL1 is formed by a method described in the embodiment of FIG. 2A to FIG. 2E, in the embodiment of FIG. 3A to FIG. 3D, or in the embodiment of FIG. 4A to FIG. 4D. That is, other anti-reflective layers (ARC2', ARC3' and ARC4') are applied, and then removed in the final structure. Subsequently, a second redistribution layer RDL2 having an anti-reflective layer ARC1' retained in between the seed layer SD and the conductive material layer CML is formed above the first redistribution layer RDL1. Based on the above, it should be noted that the different embodiments of forming the redistribution layers may be used in combination to achieve a redistribution structure RS of the disclosure.

Figure 7:
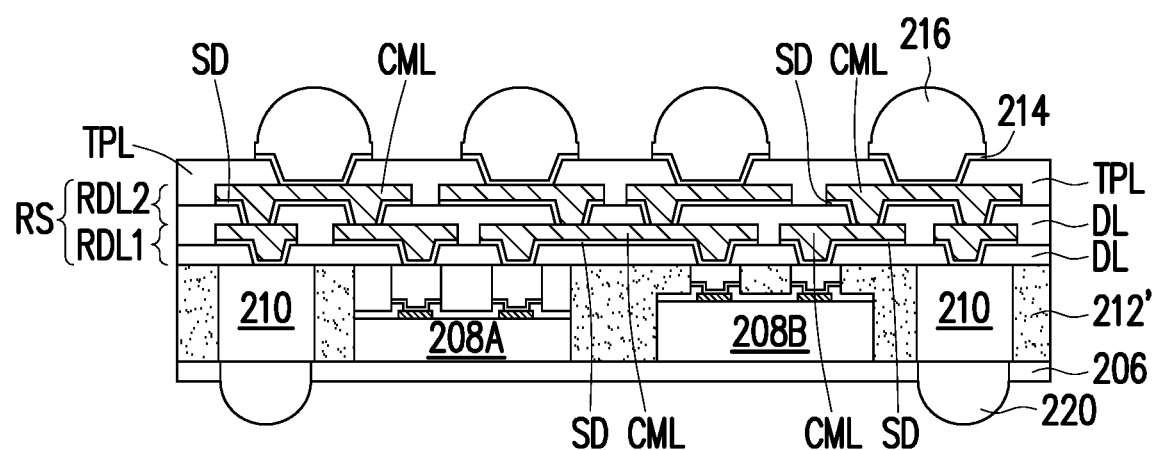
FIG. 7 is a schematic cross-sectional view of a semiconductor package according to some other exemplary embodiments of the present disclosure.

FIG. 7 is a schematic cross-sectional view of a semiconductor package according to some other exemplary embodiments of the present disclosure. The package structure shown in FIG. 7 is similar to the package structure shown in FIG. 5F, hence the same reference numerals are used to refer to the same and liked parts, and its detailed description is omitted herein. The difference between the embodiment shown in FIG. 7 and the embodiment shown in FIG. 5H is in the design of the redistribution structure RS. Referring to FIG. 7, both of the first redistribution layer RDL1 and the second redistribution layer RDL1 are formed without the anti-reflective layer ARC1' located in between the seed layer SD and the conductive material layer CML. However, in order to achieve the desired profile and reliability for the redistribution structure RS, any one of the anti-reflective layers (ARC2', ARC3' and ARC4') are still applied during the fabrication process, and then removed in the final structure.

In the above embodiments, the redistribution structure of the semiconductor package is formed with a plurality of redistribution layers, wherein each of the redistribution layer is at least formed by applying an anti-reflective layer on the photoresist. Since an anti-reflective layer is covering the seed layer and the photoresist during the patterning of the photoresist, the high reflective properties of the seed layer can be alleviated. As such, an issue of standing wave profiles of the patterned photoresist caused by reflective lights can be resolved. Furthermore, when a bottom anti-reflective layer is formed with a planar top surface, and the conductive material layer CML is also formed with planar top surface due to a bottom-up plating process, then an issue of molding pits can be resolved. Thereafter, the redistribution structure formed in subsequent steps can have a fine-pitch with the desired profile, and a reliability and performance of the redistribution structure can be improved.

In accordance with some embodiments of the present disclosure, a semiconductor package including a substrate and a redistribution structure is provided. The substrate has at least one contact. The redistribution structure is disposed on the substrate and electrically connected to the at least one contact, wherein the redistribution structure includes a plurality of redistribution layers. Each of the redistribution layers include a seed layer, a conductive material layer and a dielectric material layer. The conductive material layer is disposed on the seed layer. The dielectric material layer is surrounding the conductive material layer and the seed layer. At least one of the redistribution layers include an anti-reflective layer disposed in between the seed layer and the conductive material layer.

In some other embodiments of the present disclosure, a method of fabricating a semiconductor package is described. The method includes the following steps. A substrate having contacts is provided. A redistribution structure is formed over the substrate and electrically connected to the contacts. The method of forming the redistribution structure includes the following steps. A dielectric material layer is formed with a plurality of openings that expose the contacts of the substrate. A seed layer is formed conformally over the dielectric material layer and in the plurality of openings. A photoresist is provided on the seed layer, wherein the photoresist has an anti-reflective layer located on one surface of the photoresist. The photoresist is patterned to form a plurality of second openings. A conductive material layer is formed within the plurality of second openings over the seed layer. The photoresist is removed, and portions of the seed layer not covered by the conductive material layer is also removed. The formation of the dielectric material layer, the seed layer, the conductive material layer, the removal of the photoresist and the removal of the portions of the seed layer are repeated to form the redistribution structure having a plurality of redistribution layers.

In yet another embodiment of the present disclosure, a method of fabricating a semiconductor package is described. The method includes the following steps. A carrier is provided. At least one semiconductor die is bonded on the carrier, wherein the semiconductor die has a plurality of contacts. An insulating encapsulant is formed to encapsulate the semiconductor die. A redistribution structure is formed over the insulating encapsulant and the semiconductor die, wherein the redistribution structure is electrically connected to the plurality of contacts of the semiconductor die. The method of forming the redistribution structure includes the following steps. A dielectric material layer is formed with a plurality of openings that expose the contacts of the semiconductor die. A seed layer is formed conformally over the dielectric material layer and in the plurality of openings. A bottom anti-reflective layer is formed to cover the seed layer. A photoresist is provided on the bottom anti-reflective layer. The photoresist is patterned to form a plurality of second openings. A conductive material layer is formed within the plurality of second openings over the seed layer. The photoresist is removed, and portions of the seed layer not covered by the conductive material layer is also removed. The formation of the dielectric material layer, the seed layer, the conductive material layer, the removal of the photoresist and the removal of the portions of the seed layer are repeated to form the redistribution structure having a plurality of redistribution layers. A plurality of conductive balls is formed over the redistribution structure, wherein the plurality of conductive balls is electrically connected to the redistribution structure. The carrier is then de-bonded.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a substrate having at least one contact; and
   a redistribution structure disposed on the substrate and electrically connected to the at least one contact, wherein the redistribution structure comprises:
      a first redistribution layer disposed on the substrate and comprising a first seed layer, a first conductive material layer disposed on the first seed layer, and a first dielectric material layer surrounding the first seed layer and the first conductive material layer, wherein the first seed layer is in contact with the at least one contact of the substrate; and
      a second redistribution layer disposed on the first redistribution layer and comprising a second seed layer disposed on the first conductive material layer, a first anti-reflective layer disposed on the second seed layer, a second conductive material layer disposed on the first anti-reflective layer, and a second dielectric material layer surrounding the second seed layer, the first anti-reflective layer and the second conductive material layer, wherein the first anti-reflective layer is sandwiched in between the second seed layer and the second conductive material layer, and sidewalls of the first anti-reflective layer are aligned with sidewalls of the second seed layer and sidewalls of the second conductive material layer.

2. The semiconductor package according to claim 1, wherein the anti-reflective layer is an inorganic anti-reflective layer.

3. The semiconductor package according to claim 2, wherein the inorganic anti-reflective layer is made of titanium nitride.

4. The semiconductor package according to claim 1, wherein the anti-reflective layer is conformally disposed on the seed layer, and a profile of the anti-reflective layer corresponds to a profile of the seed layer.

5. A method of fabricating a semiconductor package, comprising:
providing a substrate having contacts; and
forming a redistribution structure over the substrate and electrically connected to the contacts, wherein the method of forming the redistribution structure comprises:
forming a dielectric material layer having a plurality of openings that expose the contacts of the substrate;
forming a seed layer conformally over the dielectric material layer and in the plurality of openings;
providing a photoresist on the seed layer, wherein the photoresist has an anti-reflective layer located on one surface of the photoresist;
patterning the photoresist to form a plurality of second openings;
forming a conductive material layer within the plurality of second openings over the seed layer;
removing the photoresist and removing portions of the seed layer not covered by the conductive material layer; and
repeating the formation of the dielectric material layer, the seed layer, the conductive material layer, the removal of the photoresist and the removal of the portions of the seed layer to form the redistribution structure having a plurality of redistribution layers.

6. The method of fabricating the semiconductor package according to claim 5, wherein the photoresist having the anti-reflective layer located on one surface is formed by:
forming a bottom anti-reflective layer on the seed layer, and providing the photoresist on the bottom anti-reflective layer so that the bottom anti-reflective layer is located on a bottom surface of the photoresist.

7. The method of fabricating the semiconductor package according to claim 6, wherein the bottom anti-reflective layer is an inorganic bottom anti-reflective layer conformally formed over the seed layer, and the inorganic bottom anti-reflective layer is retained in between the seed layer and the conductive material layer after removing the photoresist and removing portions of the seed layer not covered by the conductive material layer.

8. The method of fabricating the semiconductor package according to claim 6, wherein the bottom anti-reflective layer is an organic bottom anti-reflective layer formed over the seed layer, and wherein the photoresist and the organic bottom anti-reflective layer are patterned to form the plurality of second openings.

9. The method of fabricating the semiconductor package according to claim 8, wherein the organic bottom anti-reflective layer is removed during the removal of the photoresist.

10. The method of fabricating the semiconductor package according to claim 8, wherein the organic bottom anti-reflective layer is conformally formed over the seed layer and is formed with uniform thickness.

11. The method of fabricating the semiconductor package according to claim 8, wherein the organic bottom anti-reflective layer is formed over the seed layer with a planar top surface, and the photoresist provided on the organic bottom anti-reflective layer has uniform thickness.

12. The method of fabricating the semiconductor package according to claim 5, wherein the photoresist having the anti-reflective layer located on one surface is formed by:
providing the photoresist on the seed layer, and forming a top anti-reflective layer on a top surface of the photoresist, and wherein the photoresist and the top anti-reflective layer are patterned to form the plurality of second openings.

13. The method of fabricating the semiconductor package according to claim 12, wherein the top anti-reflective layer is removed during the removal of the photoresist.

14. A method of fabricating a semiconductor package, comprising:
providing a carrier;
bonding at least one semiconductor die on the carrier, wherein the semiconductor die has a plurality of contacts;
forming an insulating encapsulant encapsulating the semiconductor die;
forming a redistribution structure over the insulating encapsulant and the semiconductor die, wherein the redistribution structure is electrically connected to the plurality of contacts of the semiconductor die, and the method of forming the redistribution structure comprises:
forming a dielectric material layer having a plurality of openings that expose the plurality of contacts of the semiconductor die;
forming a seed layer conformally over the dielectric material layer and in the plurality of openings;
forming a bottom anti-reflective layer covering the seed layer;
providing a photoresist on the bottom anti-reflective layer;
patterning the photoresist to form a plurality of second openings;
forming a conductive material layer within the plurality of second openings over the seed layer;
removing the photoresist and removing portions of the seed layer not covered by the conductive material layer; and
repeating the formation of the dielectric material layer, the seed layer, the conductive material layer, the removal of the photoresist and the removal of the portions of the seed layer to form the redistribution structure having a plurality of redistribution layers;
forming a plurality of conductive balls over the redistribution structure, wherein the plurality of conductive balls is electrically connected to the redistribution structure; and
de-bonding the carrier.

15. The method of fabricating the semiconductor package according to claim 14, wherein the bottom anti-reflective layer is an inorganic bottom anti-reflective layer conformally formed over the seed layer, and the inorganic bottom anti-reflective layer is retained in between the seed layer and the conductive material layer after removing the photoresist and removing portions of the seed layer not covered by the conductive material layer.

16. The method of fabricating the semiconductor package according to claim 14, wherein the bottom anti-reflective layer is an organic bottom anti-reflective layer formed over the seed layer, and wherein the photoresist and the organic bottom anti-reflective layer are patterned to form the plurality of second openings, and the organic bottom anti-reflective layer is removed during the removal of the photoresist.

17. The method of fabricating the semiconductor package according to claim 16, wherein the organic bottom anti-reflective layer is conformally formed over the seed layer and is formed with uniform thickness.

18. The method of fabricating the semiconductor package according to claim 16, wherein the organic bottom anti-reflective layer is formed over the seed layer with a planar top surface, and the photoresist provided on the planar top surface of the organic bottom anti-reflective layer has uniform thickness.

19. The semiconductor package according to claim 1, wherein a material of the first anti-reflective layer is different than a material of the first seed layer and a material of the second seed layer.

20. The semiconductor package according to claim 1, wherein the first conductive material layer is in physical contact with the first seed layer and the second seed layer.

\* \* \* \* \*